(12) United States Patent
Lachenmann et al.

(10) Patent No.: US 6,856,562 B2
(45) Date of Patent: Feb. 15, 2005

(54) TEST STRUCTURE FOR MEASURING A JUNCTION RESISTANCE IN A DRAM MEMORY CELL ARRAY

(75) Inventors: Susanne Lachenmann, München (DE); Valentin Rosskopf, Pöttmes (DE); Andreas Felber, München (DE); Sibina Sukman, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/659,843

(22) Filed: Sep. 11, 2003

(65) Prior Publication Data

US 2004/0057292 A1 Mar. 25, 2004

(30) Foreign Application Priority Data

Sep. 11, 2002 (DE) .......................... 102 42 054

(51) Int. Cl.$^7$ .................................. G11C 7/00

(52) U.S. Cl. .................. 365/201; 365/149; 365/199

(58) Field of Search ................ 365/201, 149, 365/199

(56) References Cited

U.S. PATENT DOCUMENTS

| | | | | |
|---|---|---|---|---|
| 5,638,331 A | * | 6/1997 | Cha et al. | ................. 365/201 |
| 6,426,526 B1 | | 7/2002 | Divakaruni et al. | ......... 257/302 |

* cited by examiner

*Primary Examiner*—Richard Elms
*Assistant Examiner*—Pho M. Luu
(74) *Attorney, Agent, or Firm*—Laurence A. Greenberg; Werner H. Stemer; Gregory L. Mayback

(57) ABSTRACT

A test structure for determining the resistance of a conducting junction between an active region of a selection transistor and a storage capacitor in a matrix-type cell array where the active regions of the selection transistors are in rows in a first direction and the storage capacitors are in rows in a second direction running perpendicular to the first direction. The conducting junctions between the active regions of the selection transistors and the storage capacitors are formed at overlapping areas of the mutually perpendicular rows each in a single edge region of the overlapping area in the first direction. The active regions of the selection transistors and/or the storage capacitors are connected by tunnel structures or bridge structures in the second direction in the region adjoining the junction to be measured between the active region of the selection transistor and the storage capacitor. This achieves a low-impedance connection to the junction to be measured.

6 Claims, 5 Drawing Sheets

TEST STRUCTURE FOR MEASURING A JUNCTION RESISTANCE IN A DRAM MEMORY CELL ARRAY

BACKGROUND OF THE INVENTION

FIELD OF THE INVENTION

The invention relates to a test structure for determining the resistance of a conducting junction between an active region of a selection transistor and a storage capacitor in a matrix-type cell array, in particular a so-called "single-sided buried-strap" DRAM memory cell array.

Dynamic random access semiconductor memories (DRAMs) contains a matrix of memory cells connected up in the form of rows via word lines and columns via bit lines. Data are read from the memory cells or data are written to the memory cells by the activation of suitable word and bit lines. A dynamic memory cell generally comprises a selection transistor and a storage capacitor, the selection transistor usually being configured as a horizontally designed field-effect transistor and comprising two diffusion regions separated by a channel above which a gate is arranged. The gate is then connected to a word line. One of the diffusion regions of the selection transistor is connected to a bit line and the other diffusion region is connected to the storage capacitor. By the application of a suitable voltage via the word line to the gate, the selection transistor turns on and enables a current flow between the diffusion regions in order to charge the storage capacitor via the bit line.

Ongoing endeavors to miniaturize DRAM memory chips have led to the design of DRAM memory cells in which, in particular, the storage capacitor utilizes the third dimension. Trench capacitors and stacked capacitors have been developed as essential embodiments of three-dimensional storage capacitors, the trench capacitor type mainly being used for DRAM memory cells. The trench capacitor comprises a trench which is etched into the semiconductor substrate and filled with a material of high conductivity which serves as an inner capacitor electrode. By contrast, the outer capacitor electrode is buried in the substrate through a dielectric layer. The electrical connection between the diffusion region of the selection transistor and the first inner capacitor electrode is generally effected in the upper trench region by a capacitor connection usually formed as a diffusion region, the so-called "buried strap." Since the diffusion region of the selection transistor and the inner capacitor electrode of the trench capacitor are fabricated by means of separate process steps and usually with different materials, a junction resistance is produced between the diffusion region of the selection transistor and the capacitor electrode and has a significant influence on the storage capacitance to be charged and charge speed and thus on the performance features of the DRAM memory chip.

The characterization of this junction resistance between the diffusion region of the selection transistor and the storage capacitor, the so-called "buried strap" resistance measurement, is therefore among the standard electrical tests in the fabrication of DRAM memory chips. For the characterization of this junction resistance, it is usually the case that test structures are additionally formed on the semiconductor wafer in the interspace between the individual DRAM memory chips, the so-called kerf region, during the fabrication of the DRAM memory cells, which test structures are modeled on the memory cell array and afford the possibility of measuring the junction resistance between a diffusion region of a selection transistor and a storage capacitor. For this purpose, test structures are formed which make it possible to measure an individual junction resistance between a diffusion region of a selection transistor and a storage capacitor, and, moreover, test structures are formed which comprise a chain of junction resistances connected in series. The test structures can be contact-connected via additionally formed contact areas, so-called contact pads, with the aid of a needle card that is usually used for testing, in order to be able to couple the voltage and current signals in and out.

In order to fabricate DRAM memory cell arrays with a memory cell comprising a planar selection transistor and a trench capacitor, use is usually made of a process technology in which the electrical junction is independent of the orientation of the diffusion regions of the selection transistors and of the trench capacitors with respect to one another. In this fabrication method, the active regions, i.e. the diffusion regions of the selection transistor, are arranged in rows in a first direction and the storage capacitors are arranged in rows in a second direction running perpendicular to the first direction, the conducting junctions between the active regions of the selection transistors and the storage capacitors being embodied at the overlapping areas of the rows running perpendicular to one another in each case in both edge regions of the overlapping area in the first direction. Resistance measuring structures are already known for such DRAM memory cell arrays, which are also referred to as "double-sided buried-strap" or MINT (merged isolation and node trench).

The "double-sided buried-strap" cell array concept, however, is increasingly being replaced by the so-called "single-sided buried-strap" concept, which can be used to fabricate cell array geometries that can be lithographically imaged more simply. In this cell array technology, the conducting junctions between the active regions of the selection transistors and the storage capacitors are embodied at the overlapping areas of the rows of active regions of the selection transistors running perpendicular to one another in a first direction and storage capacitors in a second direction in each case only in a single edge region in the first direction of the overlapping area in the first direction. In the opposite edge region, by contrast, the active region of the selection transistor is insulated from the underlying storage capacitor. This "single-sided buried-strap" cell array concept makes it possible, in particular, to form a so-called "checkerboard" (chequerboard) cell geometry in which the memory cells are arranged at the crossover points between the active regions of the selection transistors and the storage capacitors in adjacent rows in a manner offset with respect to one another. For such "single-sided buried-strap" cell array concepts, the prior art has not yet disclosed any test structures for measuring the electrical junction resistance between the diffusion region, i.e. the active region of the selection transistor, and the storage capacitor.

SUMMARY OF THE INVENTION

It is accordingly an object of the invention to provide a test structure for measuring a junction resistance in a DRAM memory cell array which overcomes the above-mentioned disadvantages of the heretofore-known devices and methods of this general type and which provides for a measurement system for measuring the resistance of a conducting junction between an active region of a selection transistor and a storage capacitor in a matrix-type memory cell array according to the "single-sided buried-strap" concept.

With the foregoing and other objects in view there is provided, in accordance with the invention, an improved test structure for determining a resistance of a conducting junction between an active region of a selection transistor and a storage capacitor in a matrix-type cell array. The matrix cell array has active regions of selection transistors arranged in rows along a first direction and storage capacitors arranged in rows along a second direction perpendicular to the first direction. Further, conducting junctions between the active regions of the selection transistors and the storage capacitors are formed at overlapping areas of the rows running perpendicular to one another in each case in a single edge region of the overlapping area in the first direction. The improvement is characterized in that the active regions of the selection transistors and/or the storage capacitors are connected by connecting structures selected from the group consisting of tunnel structures and bridge structures in the second direction in the region adjoining the junction to be measured between the active region of the selection transistor and the storage capacitor, for attaining a low-impedance connection to the junction to be measured.

The test structure according to the invention for determining the resistance of a conducting junction between an active region of a selection transistor and a storage capacitor in a matrix-type cell array which is constructed according to the "single-sided buried-strap" concept, in which the conducting junctions between the active regions of the selection transistors and the storage capacitors are embodied at overlapping areas of the rows of active regions of the selection transistors and storage capacitors running perpendicular to one another in each case in a single edge region of the overlapping area in the direction of the row of active regions, has connecting structures between the active regions and/or the storage capacitors which correspond to tunnel structures or bridge structures and are embodied in the direction perpendicular to the junction to be measured in regions adjoining the junction to be measured. These test structures, in the case of which the leads to the conducting junction to be measured between the active region of the selection transistor and the storage capacitor are arranged essentially perpendicular to said junction, make it possible to keep the impedance of said leads as low as possible, so that they scarcely impair the measurement result, and at the same time to model the geometry of the test structure essentially on the corresponding "single-side strap" memory cell array.

In accordance with an added feature of the invention, in order to determine the resistance of a series circuit comprising a plurality of conducting junctions between active regions of selection transistors and storage capacitors in a row in the direction perpendicular to the direction of said junctions, i.e. in the second direction, the corresponding active regions of the selection transistors at the corresponding storage capacitors are alternately connected via tunnel structures or bridge structures in said second direction. This design of the test structure makes it possible to measure a multiplicity of series-connected conducting junctions without the connection between the individual conducting junctions significantly disturbing the measurement result, since the latter is kept at low impedance by the design according to the invention. Furthermore, it is thus possible to design a test structure which comes very close to the original cell array according to the "single-sided buried-strap" concept.

In accordance with an additional feature of the invention, the test structure has a matrix-type cell array which is configured as a checkerboard array, the overlapping areas with the conducting junctions between the active regions of the selection transistors and the storage capacitors being designed in such a way that said overlapping areas are arranged in rows lying next to one another in the direction of the active regions in each case in a manner offset with respect to one another, the current path for determining the resistance of the series circuit comprising a plurality of conducting junctions having a rectangular course with an alternative sequence of connected active regions and connected storage capacitors. This test structure makes it possible to come very close to a checkerboard cell array of a DRAM memory chip according to the "single-sided buried-strap" concept and at the same time to provide for low-impedance connections between the "buried-strap" resistances to be measured.

In accordance with another feature of the invention, there is the possibility of coupling a plurality of rows of series circuits with conducting junctions via a connection of the active regions of the selection transistors in the cell edge region via tunnel or bridge structures and of thus making it possible to measure a large number of conducting junctions in series.

In accordance with a further feature of the invention, the test structure is modeled on a checkerboard cell array, the current path for determining the resistance of a conducting junction between the active region of a selection transistor and a storage capacitor having an L-shaped course in the direction perpendicular to the conducting junction, with storage capacitors and/or active regions of selection transistors connected via tunnel or bridge structures. This design makes it possible, as a boundary condition for the test structure, to keep the impedance of the connection of the junction resistance to be measured as low as possible and at the same time to come as close as possible to the checkerboard cell array of the DRAM memory cells with the test structure.

Furthermore, the voltage path for the resistance measurement is also preferably formed in an L-shaped manner with storage capacitors and/or active regions of selection transistors connected perpendicular to the junction structure, the current path and the voltage path being mirror-symmetrical with respect to the active region with the conducting junction. This provides for a measuring configuration which corresponds to a four-point measurement with low lead resistances.

Other features which are considered as characteristic for the invention are set forth in the appended claims.

Although the invention is illustrated and described herein as embodied in a test structure for measuring a junction resistance in a DRAM memory cell array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention will now be explained in more detail using the example of a DRAM memory chip with a checkerboard array cell geometry. DRAM memory chips are composed of a memory cell matrix organized in rows and columns. The memory cell comprises a selection transistor and a storage capacitor, which represents the memory states "0" or "1" in accordance with its charge. In this case, the selection transistor is formed as a planar field-effect transistor with two diffusion regions which are separated by a channel and can be activated via a gate arranged above the channel. The diffusion regions with the channel represent the active region of the selection transistor. The gate of the selection transistor is connected to a word line and one of the diffusion regions of the active region is connected to a bit line of the DRAM memory chip. The other diffusion region is connected to the storage capacitor via a capacitor connection region, generally an enlarged diffusion region. This capacitor connection is also referred to as a "buried strap" if the storage capacitor is formed as a trench capacitor. The selection transistor is then connected to the inner capacitor electrode formed in the trench of the trench capacitor, the inner capacitor electrode being isolated from an outer capacitor electrode, which is generally arranged in buried fashion, by a dielectric layer.

Figure 1A:
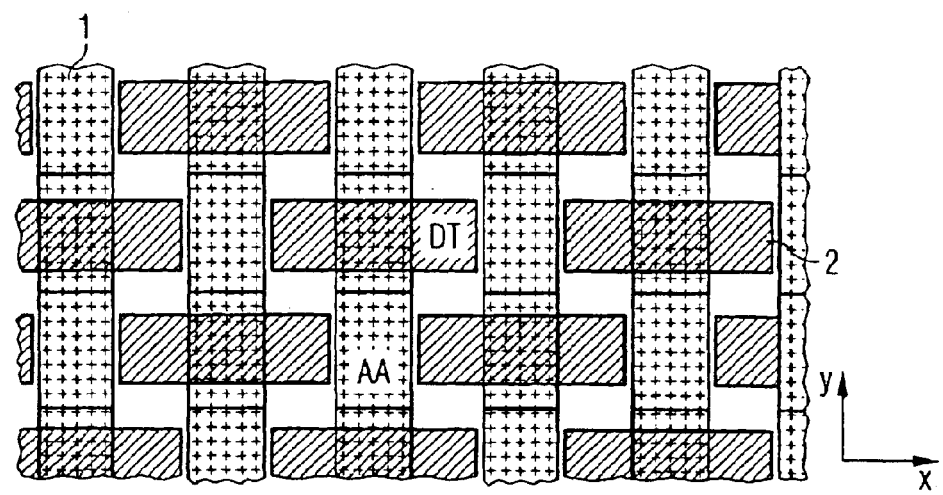
FIG. 1A is a diagrammatic plan view of a "single-sided buried-strap" cell array with checkerboard geometry.

The DRAM memory cells are usually fabricated with the aid of silicon planar technology. An advantageous DRAM memory concept is the "single-sided buried-strap" concept, which is illustrated diagrammatically in FIG. 1 using the example of a checkerboard cell array. In this case, the cell array is composed of active regions running in vertical rows and rectangular storage capacitor regions running horizontal rows. Referring now to the figures of the drawing in detail and first, particularly, to FIG. 1A thereof, the plan view shows the rows with active regions 1 and the rows with storage capacitors 2 running horizontally with respect thereto. The active regions 1 are connected to the storage capacitors 2 in the region of the overlapping areas, in which case, according to the "single-sided buried-strap" concept, the selection transistors with the storage capacitors are connected to one another in each case in a single edge region of the overlapping area in the direction of the active regions. The conducting junctions between the selection transistors and the storage capacitors are identified by circles in FIG. 1B, whereas the intersection edges that are electrically isolated from one another in the region of the overlapping areas are marked by crosses.

Figure 1B:
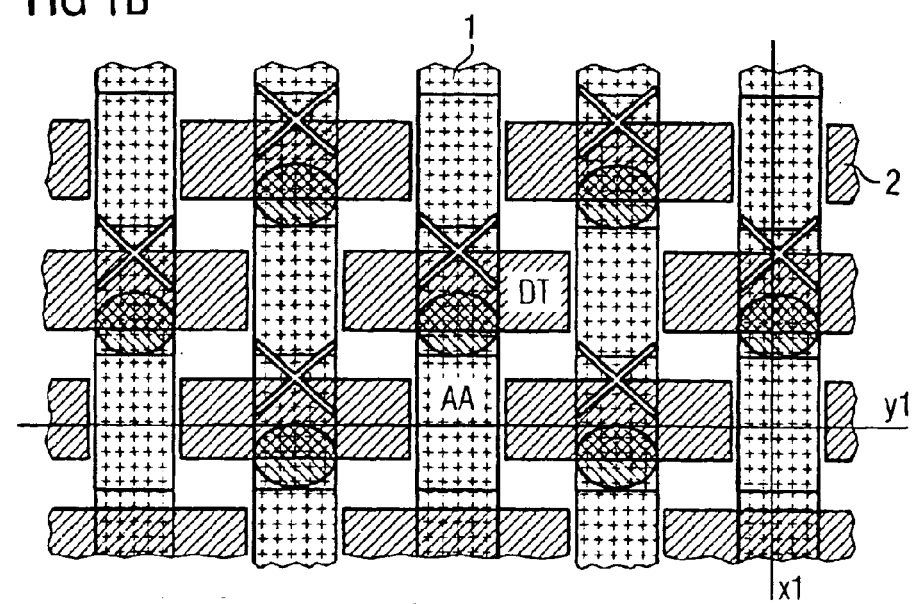
FIG. 1B is a diagrammatic plan view thereof, with conducting "buried-strap" junctions marked by circles and electrically isolated edge regions marked by crosses.
Figure 1C:
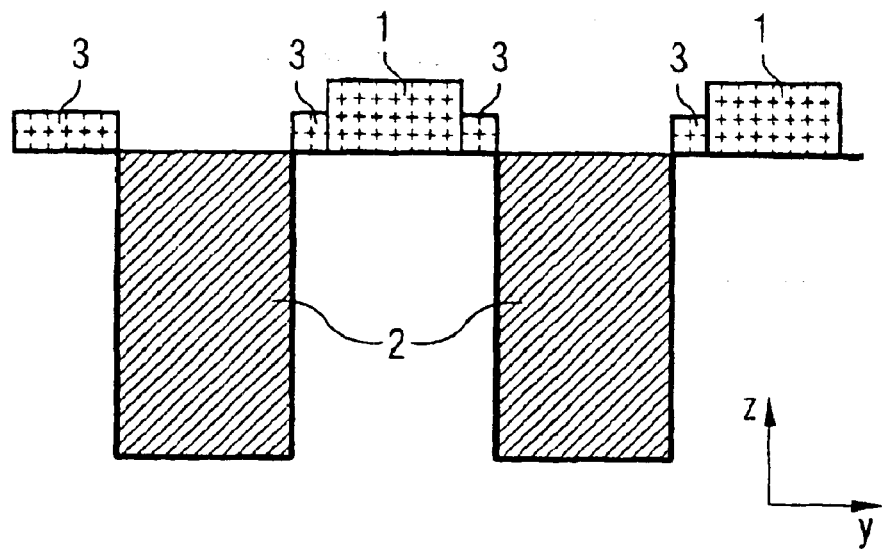
FIG. 1C is a sectional view of a section taken along the line x1 in FIG. 1B.
Figure 1D:
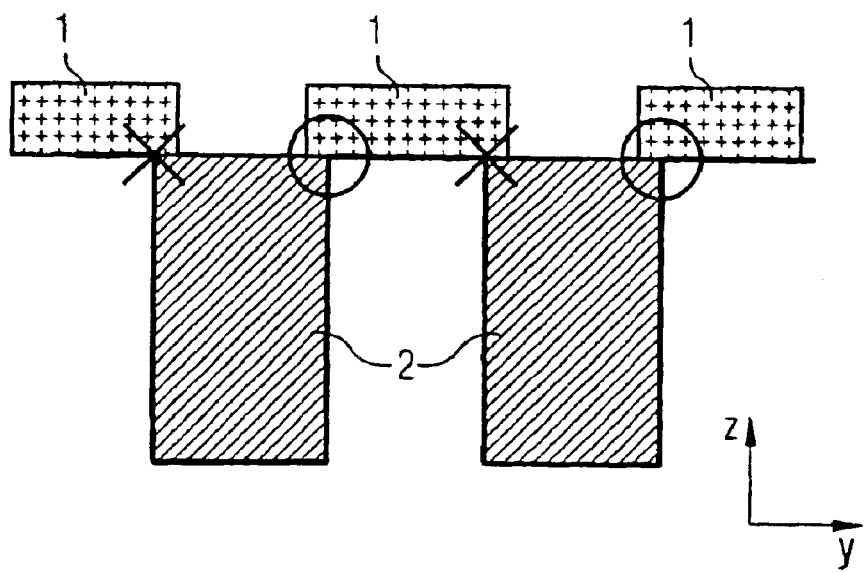
FIG. 1D is a cross section taken along the line y1 in FIG. 1B.

In the checkerboard cell geometry illustrated in FIG. 1, as can be seen from FIG. 1B, the memory cells with coupled-together selection transistor and storage capacitor are in each case arranged in a manner offset with respect to one another, i.e. in the rows with active regions running perpendicular to one another a connection between the storage capacitor and the active regions is produced in each case only at every second intersection area, the conducting junctions being arranged in adjacent rows in a manner offset with respect to one another. FIG. 1C shows a section through the DRAM memory cell array along the y1 line in FIG. 1B. In this case, the active regions 1 are isolated from the storage capacitors 2 by insulator regions 3, i.e. no current flows through the cell array arrangement in this direction. FIG. 1D furthermore shows a sectional view along the x1 line, the conducting junctions between the active regions 1 and the storage capacitors again being identified by circles and the blocking junctions being identified by crosses. In this case, the conducting junctions between the active regions and the storage capacitors are preferably produced by means of an additional inclined doping implantation.

FIG. 2 shows a test structure according to the invention for determining the junction resistance between the active regions of the selection transistors and the storage capacitor. The test structure is preferably formed in the kerf region, i.e. the region on a wafer between two DRAM memory chips. In the test structures shown, the junction resistance is intended to be measured at a chain of series-connected electrical junctions. As shown in FIG. 2A, the test structure is in this case very similar to the DRAM cell structure illustrated in FIG. 1, i.e., with perpendicularly running rows of active regions 3 and transversely running rows with rectangular storage capacitors 4. In this case, the circles represent the electrical junctions to be measured between the active regions of the selection transistor and the associated storage capacitors.

Figure 2A:
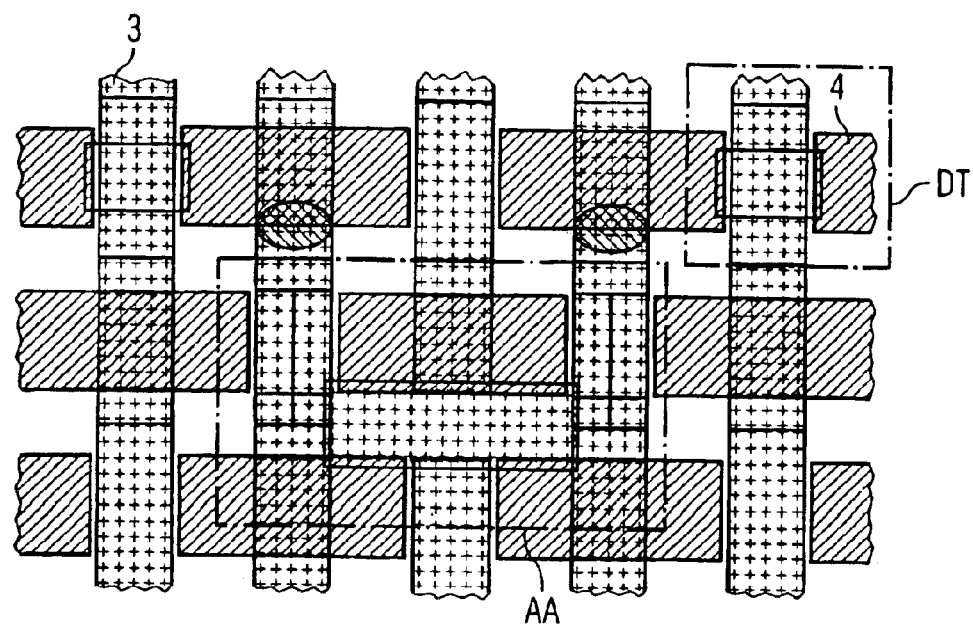
FIG. 2A is a diagrammatic plan view of a "single-sided buried-strap" test structure cell array according to the invention with checkerboard geometry with a series circuit of conducting junctions.
Figure 2B:
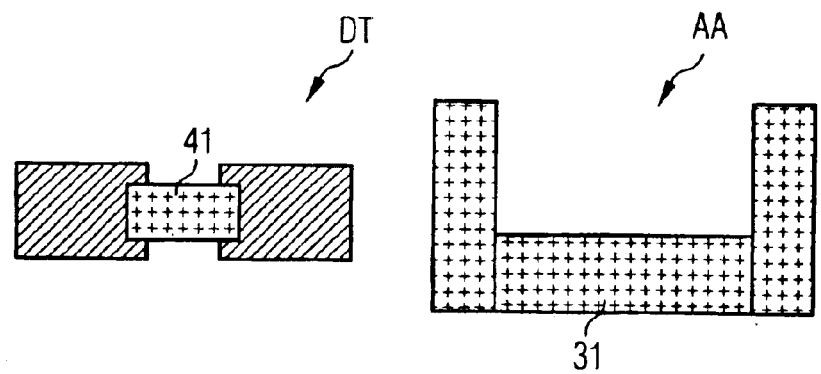
FIG. 2B show two detail views from FIG. 2A.

In order to achieve a current flow between the series-connected DRAM memory cells for the purpose of measuring the electrical junction resistances between the active regions of the selection transistors and the storage capacitors, as is illustrated in FIG. 2 in enlarged fashion using details from FIG. 2A, electrical connections are produced transversely with respect to the conducting junctions between the storage capacitors and the active regions. FIG. 2B shows a bridge structure 41 between storage capacitors and a clip structure 31 between the active regions. As an alternative to such bridge or clip structures, there is also the possibility of forming tunnel structures between the storage capacitors and active regions.

Figure 2C:
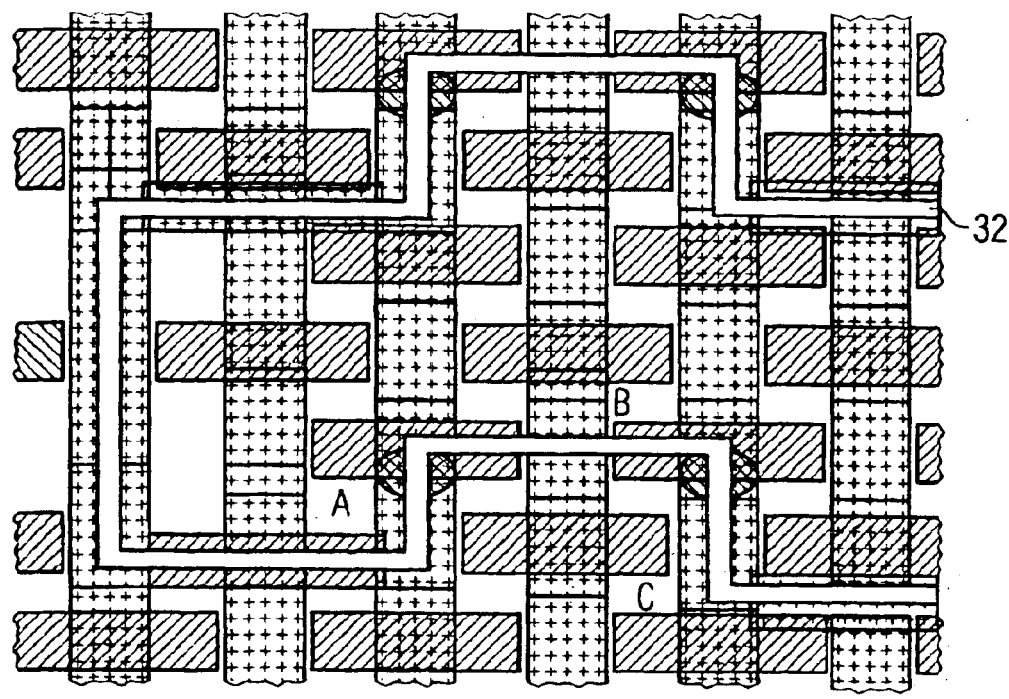
FIG. 2C is a plan view diagram illustrating a current path.

FIG. 2C shows the current path thus produced between the conducting junctions identified by circles. Relative to a series circuit of series-connected electrical junctions lying in series on a horizontal line next to one another, said current path has a rectangular course with an alternating sequence of clips between active regions and bridges between storage capacitors which are in each case arranged in the region adjoining the conducting junctions.

Figure 2D:
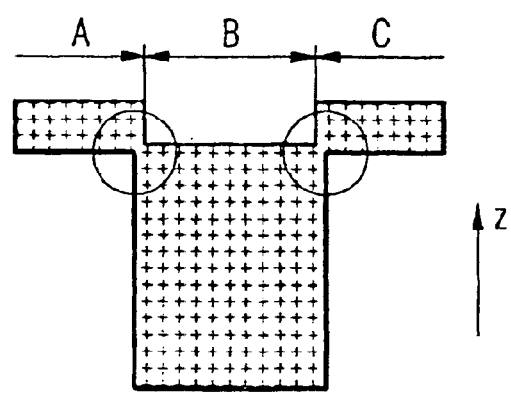
FIG. 2D is a section taken along the current path in FIG. 2C.

In order to be able to produce a connection between a plurality of horizontal rows of series-connected conducting junctions and thus to permit the measurement of a large number of electrical junctions in series, the rows lying next to one another are coupled to one another in the region of the cell array edge by a connection of the active regions 32 in the form of a C-shaped bridge structure, as shown in FIG. 2C. FIG. 2D shows a sectional view along the current path of FIG. 2C in the region of the sections A to C. The tunnel or bridge structure between the active regions and the storage capacitors enables a current flow through the arrangement and thus the measurement of the electrical junction resistances in the region of the memory cells depicted by circles. In this case, the arrangement according to the invention produces a low-impedance connection between the electrical junction resistances to be measured, at the same time the geometry of the test structure coming as close as possible to the corresponding "single-sided strap" memory cell array with checkerboard geometry.

Figure 3B:
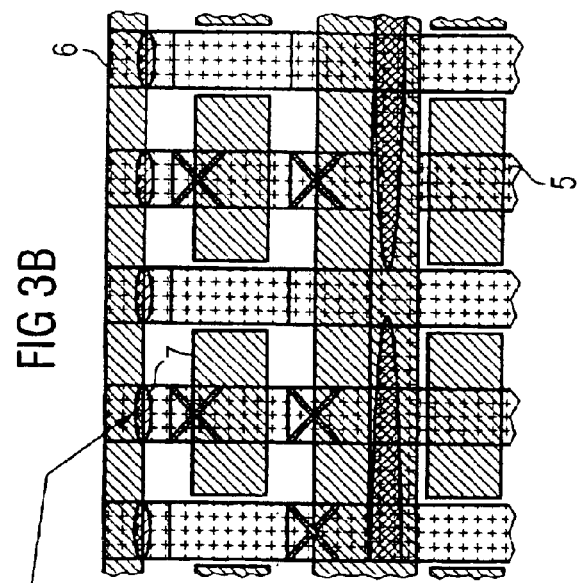
FIG. 3B is a similar plan view with an identification of the conducting junctions and of the insulated intersection edges.
Figure 3A:
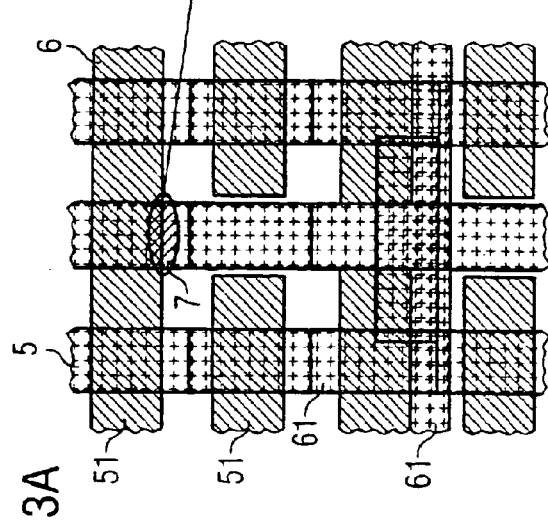
FIG. 3A is a diagrammatic plan view of a "single-sided buried-strap" test structure cell array according to the invention for measuring an individual contact.

FIG. 3 shows a second embodiment of the invention for measuring an individual junction resistance between an active region of a selection transistor and a storage capacitor. In this case, the test structure again has, running perpendicular to one another, rows of active regions 5 and transversely running rows of rectangular storage capacitors 6, the arrangement once again being modeled on the checkerboard cell array of the DRAM memory chip. The electrical junction to be measured between the active region and the storage capacitor is marked by an arrow in FIGS. 3A and 3B, the conducting electrical junctions being identified by circles and the insulating electrical junctions being identified by crosses. For the measurement, the upper lead to the conducting junction is formed by a continuous track 51 of storage capacitors. By contrast, the lower lead is formed as a continuous clip between the active regions 61.

Figure 3C:
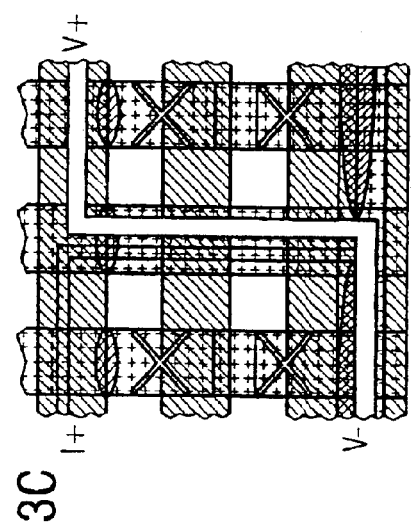
FIG. 3C is a plan view with the current and voltage path.

FIG. 3C shows the current and voltage path for the measurement of the electrical junction, for the measurement the so-called "force high" being present at I+ and the so-called "force low" being present at I−. This enables a current path from the transversely running storage capacitor track 51 via the electrical junction to be measured and the adjoining perpendicularly running active region to the transversely running clip track of the active regions. The voltage can then be measured between V+ and V−, as shown in FIG. 3C, so that the configuration comes very close to a four-point measurement, only the vertical active region between the electrical junction to be measured and the transversely running leads 51, 61 contributing to the series resistance and thus influencing the measured value.

By means of the invention, the lead resistances with respect to the electrical junction to be measured are kept as low as possible, the geometry of the test structure essentially corresponding to the DRAM memory cell array of the memory chip.

The novel configuration of the test structure with bridges between the active regions and storage capacitors that are formed transversely with respect to the junctions to be measured between the selection transistors and storage capacitors renders it possible, in a simple way, to model the geometry of the test structure and the original memory cell array as simply as possible and at the same time, as a boundary condition, to keep as low as possible the lead resistances or the resistances between the electrical junctions to be connected.

We claim:

1. An improved test structure for determining a resistance of a conducting junction between an active region of a selection transistor and a storage capacitor in a matrix-type cell array, wherein:

the matrix cell array has active regions of selection transistors arranged in rows along a first direction and storage capacitors arranged in rows along a second direction perpendicular to the first direction; and conducting junctions between the active regions of the selection transistors and the storage capacitors are formed at overlapping areas of the rows running perpendicular to one another in each case in a single edge region of the overlapping area in the first direction;

the improvement which comprises:

the active regions of the selection transistors and/or the storage capacitors are connected by connecting structures selected from the group consisting of tunnel structures and bridge structures in the second direction in the region adjoining the junction to be measured between the active region of the selection transistor and the storage capacitor, for attaining a low-impedance connection to the junction to be measured.

2. The test structure according to claim 1, wherein, for determining a resistance of a series circuit comprising a plurality of the conducting junctions between active regions of selection transistors and storage capacitors in a row in the second direction, the corresponding active regions of the selection transistors and the corresponding storage capacitors are alternately connected via tunnel structures and bridge structures in the second direction.

3. The test structure according to claim 2, wherein the matrix-type cell array is a checkerboard array, the conducting junctions between the active regions of the selection transistors and the storage capacitors are formed at overlapping areas of the rows running perpendicular to one another in each case at every other overlapping area in a row in the first direction, the overlapping areas with the conducting junctions of rows lying next to one another in the first direction are offset with respect to one another, the current path for determining the resistance of the series circuit comprising a plurality of conducting junctions between active regions of selection transistors and the storage capacitors in a row in the second direction have a rectangular course with an alternating sequence of active regions of the selection transistors connected via tunnel structures or bridge structures in the second direction and of storage capacitors connected via tunnel structures or bridge structures in the second direction.

4. The test structure according to claim 3, wherein, for determining the resistance of a series circuit comprising a plurality of conducting junctions between active regions of selection transistors and storage capacitors, a plurality of rows of series circuits comprising a plurality of conducting junctions between active regions of selection transistors and storage capacitors in the second direction are connected in a cell edge region via tunnel structures or bridge structures between the active regions of the selection transistors.

5. The test structure according to claim 1, wherein the matrix-type cell array is a checkerboard array, the conducting junctions between the active regions of the selection transistors and the associated storage capacitors are formed at overlapping areas of the rows running perpendicular to one another in each case at every other overlapping area in a row in the first direction, the overlapping areas with the conducting junctions of rows lying next to one another in the first direction are offset with respect to one another, the current path for determining the resistance of the conducting junction between the active region of the selection transistor and the storage capacitor have an L-shaped course with active regions and/or storage capacitors connected via tunnel structures or bridge structures in the second direction.

6. The test structure according to claim 5, wherein a voltage path for determining the resistance of the conducting junction between the active region of the selection transistor and the storage capacitor has an L-shaped course with active regions and/or storage capacitors connected via tunnel structures or bridge structures in the second direction, a current path and the voltage path are disposed mirror-symmetrically with respect to the active region with the conducting junctions in the first direction.

* * * * *